United States Patent [19]

Dinan et al.

[11] Patent Number: 4,589,192

[45] Date of Patent: May 20, 1986

[54] HYBRID EPITAXIAL GROWTH PROCESS

[75] Inventors: John H. Dinan, Alexandria; William A. Gutierrez, Woodbridge, both of Va.

[73] Assignee: The United States of America as represented by the Secretary of the Army, Washington, D.C.

[21] Appl. No.: 667,699

[22] Filed: Nov. 2, 1984

[51] Int. Cl.⁴ .......................................... H01L 21/363
[52] U.S. Cl. .................................. 29/572; 29/576 E; 148/175
[58] Field of Search ............... 148/174, 175, 171; 156/610, DIG. 72; 29/572, 576 E; 252/62.3 ZT

[56] References Cited

U.S. PATENT DOCUMENTS

| | | | |
|---|---|---|---|
| 3,496,024 | 2/1970 | Ruehrwein | 156/DIG. 72 |
| 3,858,074 | 12/1974 | Fukai et al. | 252/62.3 ZT |
| 3,884,788 | 5/1975 | Maciolek et al. | 156/DIG. 72 |
| 3,915,765 | 10/1975 | Cho et al. | 148/175 |
| 3,969,164 | 7/1976 | Cho et al. | 156/610 X |
| 4,116,725 | 9/1978 | Shimizu | 148/DIG. 64 |
| 4,318,217 | 3/1982 | Jenner et al. | 29/572 |
| 4,376,663 | 3/1983 | Wang et al. | 29/572 X |
| 4,435,224 | 3/1984 | Durand | 156/DIG. 72 |
| 4,439,266 | 3/1984 | Gentile et al. | 156/DIG. 72 |
| 4,445,965 | 5/1984 | Milnes | 148/171 X |
| 4,517,047 | 5/1985 | Chang et al. | 148/175 X |

Primary Examiner—George T. Ozaki
Attorney, Agent, or Firm—Max L. Harwell; Aubrey J. Dunn; Anthony T. Lane

[57] ABSTRACT

A method of making infrared detectors on a substrate of mercury cadmium telluride (HgCdTe) or mercury zinc telluride (HgZnTe). The steps include those of preparing the substrate, etching and passivating it, and placing it in the ultra-high vaccuum environment of a molecular beam epitaxy apparatus. While in the apparatus, one or more layers of zinc cadmium telluride (ZnCdTe) are deposited. When the ZnCdTe deposition is finished, the substrate is removed from the apparatus and the detectors are delineated lithographically.

2 Claims, 1 Drawing Figure

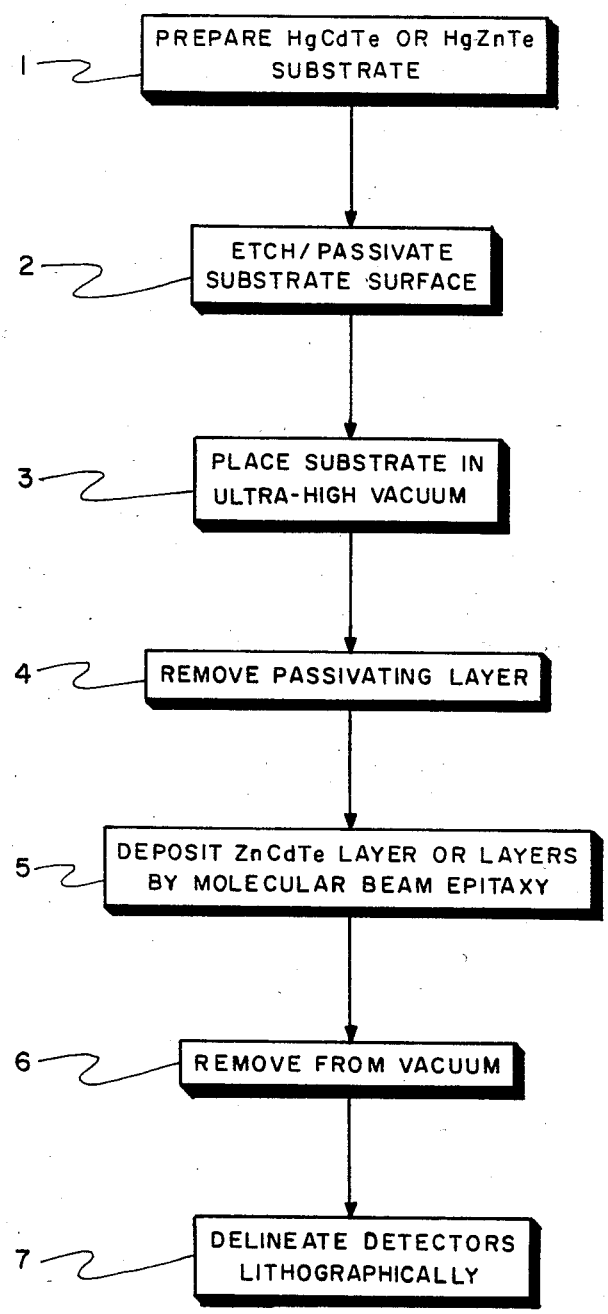

HYBRID EPITAXIAL GROWTH PROCESS

The invention described herein may be manufactured, used, and licensed by the U.S. Government for governmental purposes without the payment of any royalties thereon.

BACKGROUND OF THE INVENTION

This invention is in the field of semiconductor infrared detectors. In particular, it is concerned with multilayered epitaxially-grown devices in which one layer is a low band-gap semiconductor such as HgCdTe and another layer is a wider band-gap semiconductor such as ZnCdTe. Various growth techniques have proven successful in the preparation of single layer devices. These include liquid phase epitaxy, vapor phase epitaxy, close-spaced vapor phase epitaxy, organo-metallic vapor phase epitaxy and molecular beam epitaxy. None of these has been successfully used to provide multilayered structures. All but molecular beam epitaxy must be performed at substrate temperatures too high to allow high quality junction formation between the various layers. The molecular beam epitaxy technique is, in principle, capable of producing all layers of a structure but the technology of growth for HgCdTe, a prime constituent of the structure, is not yet mature. The instant invention capitalizes on the maturity of the other techniques, avoids their drawbacks, and capitalizes on the low-temperature characteristic of molecular beam epitaxy.

SUMMARY OF THE INVENTION

The invention is a method of making a multilayered infrared detector structure which contains HgCdTe, or a related low band-gap material, as one of its layers. The method consists in the use of a "hybrid" growth technique in which the low band-gap layer is grown by a conventional technique and the wider band-gap layer is grown by molecular beam epitaxy.

BRIEF DESCRIPTION OF THE DRAWING

The single drawing FIGURE is a flow chart of the inventive method.

DETAILED DESCRIPTION OF THE INVENTION

The invention may be best understood if this description is taken in conjunction with the flow chart of the drawing. The invention begins in step 1 with the preparation of a substrate of HgCdTe or a related material such as HgZnTe. This substrate may be a wafer sawn from a boule or an epitaxial layer grown on some substrate. In either case, the wafer or layer is considered the substrate (and will be so called) for the further steps of the method. Continuing, the substrate is etched and passivated in step 2 by dipping into an etching/chemical passivating solution if the surface is smooth enough for device applications. If necessary, the substrate may be polished by the usual methods, then etched and passivated. In step 3, the substrate is placed in the ultra-high vacuum environment of a molecular beam epitaxy (MBE) growth apparatus. The passivating layer, whose function was to prevent carbon from accumulating on the substrate prior to placement in the MBE apparatus, is removed in step 4 by ion sputtering or laser-assisted desorption. In step 5, a wide band-gap layer is deposited by molecular beam epitaxy. ZnCdTe is the preferred material, although other materials may be used. Depending on the final use of the device, one or more layers of ZnCdTe, of different component ratios, may be used. For example, if the final device is to be a photovoltaic detector, one layer of ZnCdTe is sufficient; if a full monolithic detector, two layers can be applied. When deposition of the layer or layers is complete, the substrate is removed from the vacuum, as set forth in step 6. Finally, the detectors on the substrate are delineated by lithographically removing selected portions of the layers. Obviously, any necessary bias or read-out conductors may be added in the usual manner. Typical values for composition and thickness of a ZnCdTe layer are: $Zn_{0.05}Cd_{0.95}Te$ and 1 $\mu$m.

We claim:

1. A method of making at least one infrared detector from a low band-gap material, including the steps of:
    (1) preparing a substrate with at least one HgCdTe or HgZnTe layer;
    (2) etching and passivating said layer;
    (3) placing said substrate in an ultra-high vacuum environment;
    (4) removing the passivation from said layer;
    (5) forming at least one ZnCdTe layer on said substrate by molecular beam epitaxy,
    (6) removing said substrate from said ultra-high vacuum environment; and
    (7) delineating at least one detector on said substrate.

2. The method as set forth in claim 1 when step (1) consists of depositing a HgCdTe or HgZnTe layer on a substrate.

* * * * *